United States Patent
Abe

(10) Patent No.: US 6,687,891 B2
(45) Date of Patent: Feb. 3, 2004

(54) WIRING CONNECTION CHECKING APPARATUS AND METHOD FOR CAD SYSTEM AND RECORDING MEDIUM ON WHICH PROGRAM THEREFOR IS RECORDED

(75) Inventor: Takashi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 195 days.

(21) Appl. No.: 09/858,484

(22) Filed: May 17, 2001

(65) Prior Publication Data

US 2001/0044926 A1 Nov. 22, 2001

(30) Foreign Application Priority Data

May 18, 2000 (JP) ........................................ 2000-147019

(51) Int. Cl.[7] .............................................. G06F 17/50
(52) U.S. Cl. .............................. 716/11; 716/8; 716/12; 716/5
(58) Field of Search ................................ 716/8, 11, 12, 716/14, 9, 5; 345/964

(56) References Cited

U.S. PATENT DOCUMENTS 4,855,726 A * 8/1989 Nishio ......................... 345/440
6,117,183 A * 9/2000 Teranishi et al. .............. 716/11
6,321,370 B1 * 11/2001 Suzuki et al. .................. 716/11
6,330,705 B1 * 12/2001 Matsushita et al. ............ 716/11
6,510,539 B1 * 1/2003 Deemie et al. ................ 716/2

\* cited by examiner

*Primary Examiner*—Tom Thomas
*Assistant Examiner*—Douglas W. Owens
(74) *Attorney, Agent, or Firm*—McGinn & Gibb, PLLC

(57) ABSTRACT

A wiring connection checking apparatus and method is disclosed by which a connection condition of wiring lines and terminals of parts can be visually checked readily on a screen. When wiring connection information representative of a connection condition of wiring lines and terminals of parts is updated, then a wiring updating detection section detects that contents of the updating relate to increase or decrease of the quantity of terminals of parts connected by a wiring line, and outputs connection increase/decrease information representative of such increase/decrease. A wiring display color changing section of a display color changing section changes a display color of the pertaining wiring line from within the wiring connection information based on the connection increase/decrease information. If necessary, apart terminal display color changing section of the display color changing section changes the display color of a terminal of a part connected by the wiring line. A result of the operation of the display color changing section is displayed on a screen of a display section.

15 Claims, 5 Drawing Sheets

WIRING CONNECTION CHECKING APPARATUS AND METHOD FOR CAD SYSTEM AND RECORDING MEDIUM ON WHICH PROGRAM THEREFOR IS RECORDED

BACKGROUND OF THE INVENTION

1. Field of the Invention

The present invention relates to a CAD (computer aided design) system for designing a circuit on a screen of a CRT (cathode ray tube) or the like, and more particularly to a wiring connection checking apparatus and method for checking a connection condition of a wiring line and a recording medium on which a program for the wiring connection checking method is recorded.

2. Description of the Related Art

Conventionally, a CAD system is configured such that a user can check all wiring connection information inputted by the user by referring to a data file described in characters called a net list.

Where a connection condition of wiring lines includes, for example, an unconnected wiring line, it cannot be discriminated by the CAD system whether the connection condition is based on an intention of the user or arises from an input error. In other words, the condition is not described as an error in the net list. Therefore, the conventional CAD system has a problem in that it does not allow the user to check the condition readily.

SUMMARY OF THE INVENTION

It is an object of the present invention to provide a wiring connection checking apparatus and method and a recording medium having a program for the method recorded thereon by which a connection condition of wiring lines and terminals of parts can be visually checked readily on a screen.

In order to attain the object described above, according to an aspect of the present invention, there is provided a wiring connection checking apparatus for a CAD system for designing a circuit on a screen, comprising a wiring updating detection section for detecting, based on wiring connection information inputted by a user of the wiring connection checking apparatus, that a connection condition of a wiring line is updated, a display color changing section for changing the display color of the wiring line or/and the display color of apart terminal connected by the wiring line in response to contents of the updating of the wiring connection information, and a display section for displaying a result of the changing by display color changing section on the screen.

The wiring updating detection section may detect increase or decrease of the quantity of part terminals connected by the wiring line.

With the wiring connection checking apparatus, since the display color of a wiring line on the screen changes in response to increase or decrease of the quantity of part terminals connected by the wiring line, the connection condition of the wiring line can be visually checked readily. Accordingly, the user can check readily on the screen whether or not the connection condition of the wiring line conforms with the intention of the user itself.

According to another aspect of the present invention, there is provided a wiring connection checking method for a CAD system for designing a circuit on a screen, comprising the steps of detecting, based on wiring connection information inputted by a user of the CAD system, that a connection condition of a wiring line is updated, changing the display color of the wiring line or/and the display color of apart terminal connected by the wiring line in response to contents of the updating of the wiring connection information, and displaying a result of the changing of the display color on the screen.

According to a further aspect of the present invention, there is provided a recording medium on which a computer-readable program used for checking of connection of a wiring line in a CAD system for designing a circuit on a screen, the program causing a computer to execute a wiring updating detection process of detecting, based on wiring connection information inputted by a user of the CAD system, that a connection condition of a wiring line is updated, a display color changing process of changing the display color of the wiring line or/and the display color of a part terminal connected by the wiring line in response to contents of the updating of the wiring connection information, and a displaying process of displaying a result of the changing of the display color on the screen.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
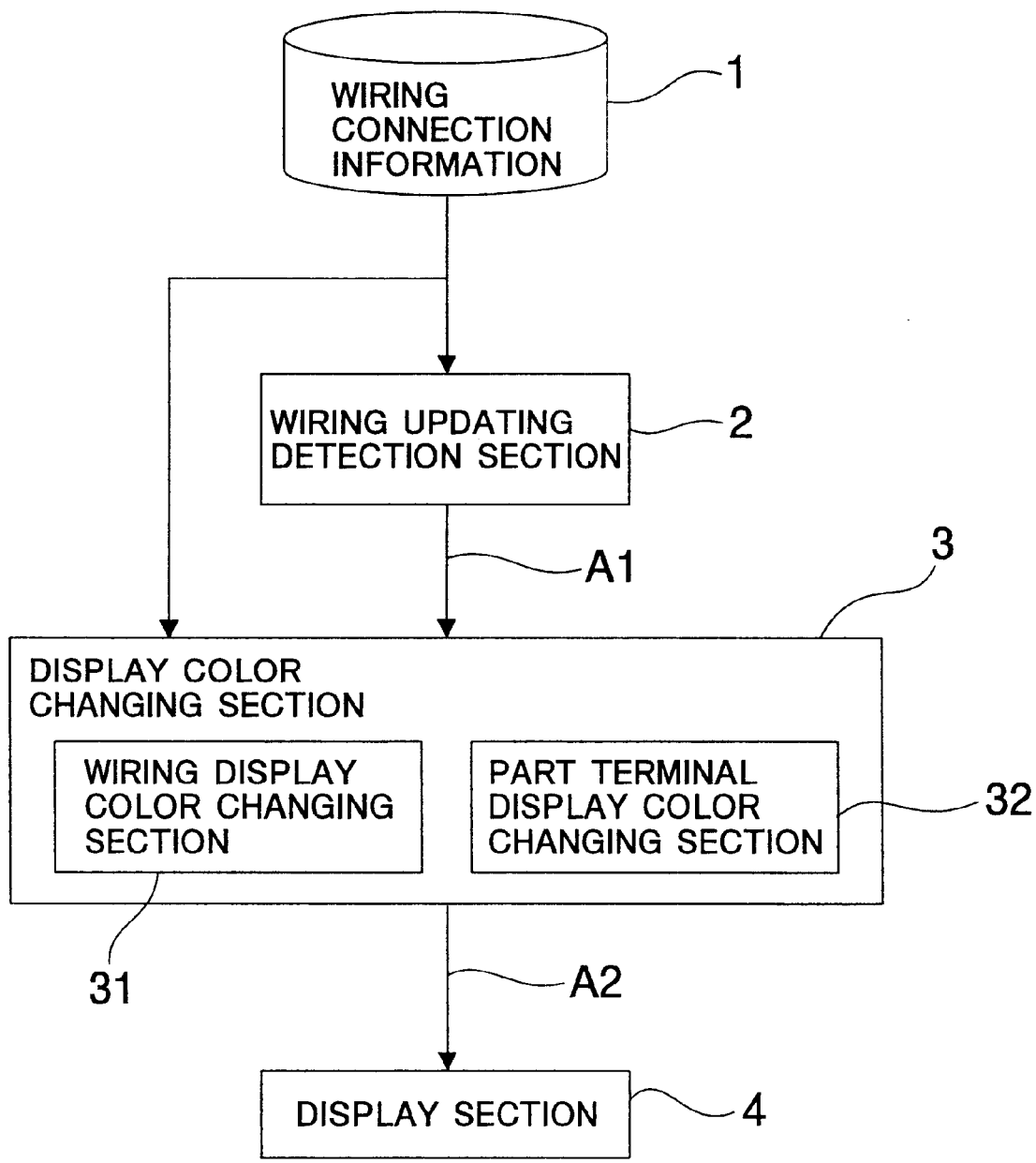
FIG. 1 is a block diagram of a wiring connection checking apparatus to which the present invention is applied.

Referring first to FIG. 1, there is shown a wiring connection checking apparatus to which the present invention is applied. If wiring connection information 1 representative of a connection condition of wiring lines and terminals of parts is updated, then a wiring updating detection section 2 detects that contents of the updating relate to increase or decrease, that is, variation, of the quantity of terminals of parts connected by a wiring line, and outputs connection increase/decrease information A1 representative of such increase/decrease. A display color changing section 3 changes a display color of the pertaining wiring line from within the wiring connection information 1 based on the connection increase/decrease information A1 (wiring display color changing section 31) and, if necessary, changes the display color of a terminal of a part connected by the wiring line (part terminal display color changing section 32). A result of the operation of the display color changing section 3 is displayed on a screen of a display section 4.

Figure 2:
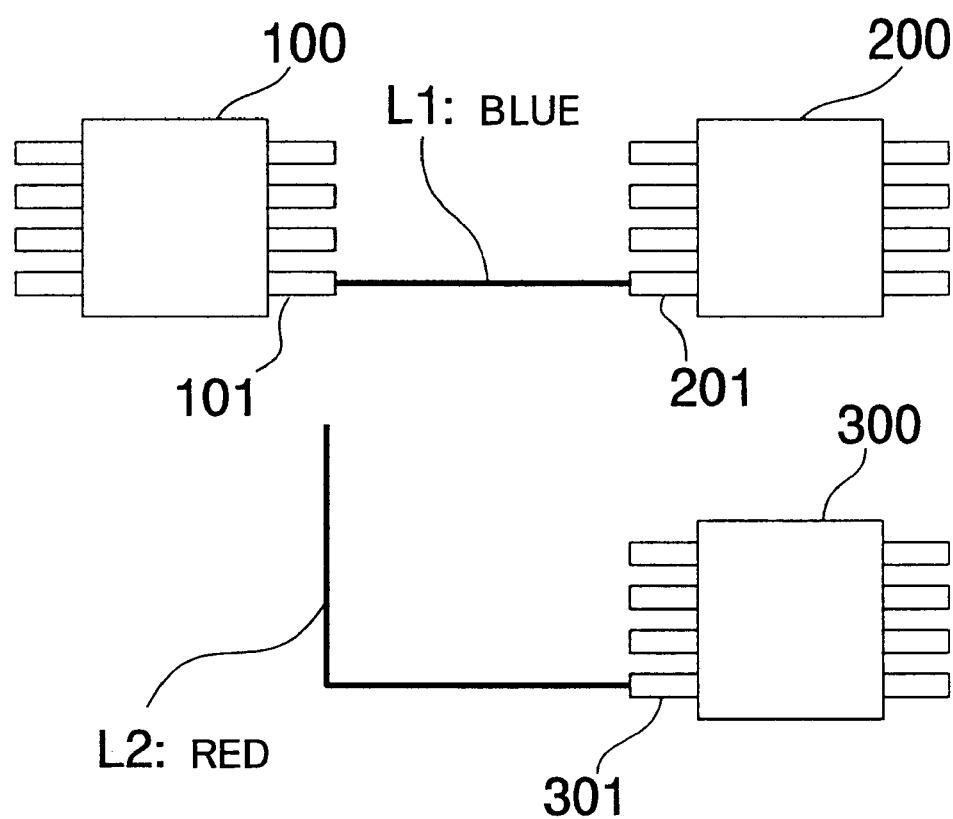
FIGS. 2, 3 and 4 are schematic views showing different stages of condition transition of a display on a screen of the wiring connection checking apparatus of FIG. 1.

Now, detailed operation of the wiring connection checking apparatus is described with reference to FIGS. 2 to 4 that illustrate an example of condition transition of the display on the screen of the wiring connection checking apparatus. Particularly, operation of the wiring connection checking apparatus when only the wiring display color changing section 31 of the display color changing section 3 operates is described. FIG. 2 illustrates an initial state of the display on the screen. Referring to FIG. 2, parts 100, 200 and 300 are disposed, and a wiring line L1 connects to a terminal 101 of the part 100 and a terminal 201 of the part 200 while another wiring line L2 connects, at one terminal point thereof, to a terminal 301 of the part 300, but is not connected at the other terminal point thereof. In this instance, the quantity of part terminals connected by the wiring line L1 is "2", and the wiring line L1 is displayed in a display color corresponding to the connection terminal quantity "2". Meanwhile, the quantity of terminals connected by the wiring line L2 is "1", and the wiring line L2 is displayed in a display color corresponding to the connection terminal quantity "1". Here, it is assumed that the display color corresponding to the connection terminal quantity "1" is red and the display color corresponding to the connection terminal quantity "2" is blue.

Figure 3:
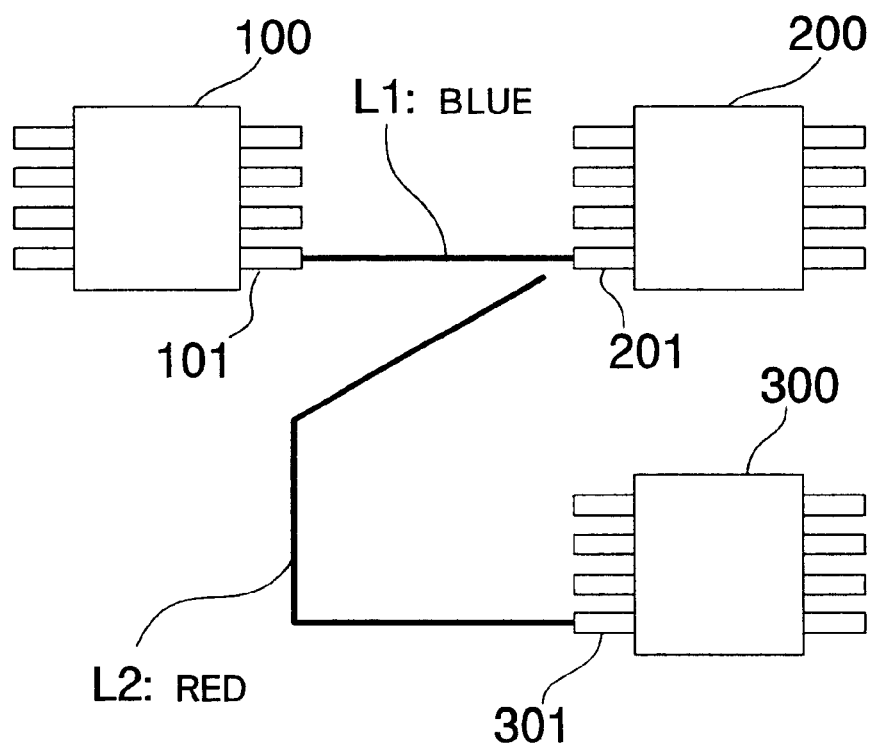

FIG. 3 shows a display on the screen when the terminal point in the unconnected condition of the wiring line L2 is extended toward the terminal 201 as a result of transition of the condition from that of FIG. 2. It is to be noted that, although the terminal point in question of the wiring line L2 seems connected to the terminal 201 on the screen in FIG. 3, actually it is not in a connected state. In this instance, the wiring connection information 1 is not updated, and consequently, the wiring updating detection section 2 does not output the connection increase/decrease information A1. Accordingly, the display color changing section 3 does not operate, and the display color of the wiring line does not change from that of FIG. 2.

Figure 4:
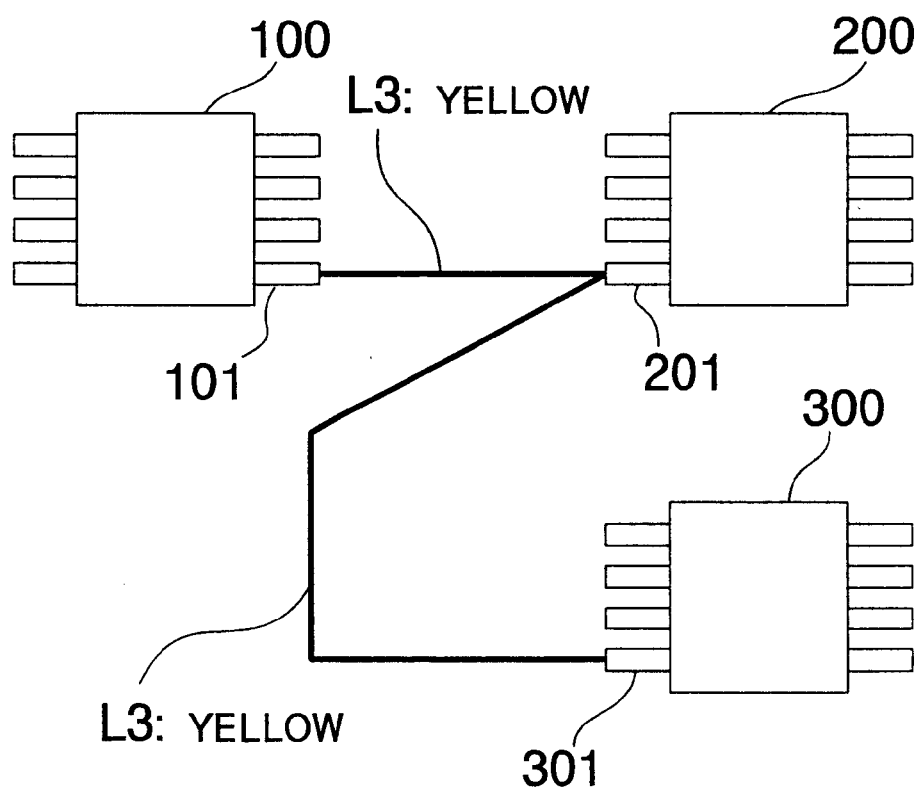

FIG. 4 shows a display on the screen when the terminal point in the unconnected state of the wiring line L2 is connected to the terminal 201 and the wiring line L1 as a result of transition of the condition from that of FIG. 3 by operation of the user. As a result of the operation described, information of a new wiring line L3 which connects to the terminals 101, 201 and 301 and whose connection terminal quantity is "3" is added to the wiring connection information 1, and the information of the wiring line L1 and the wiring line L2 is abandoned. The wiring updating detection section 2 detects, from the updating contents of the wiring connection information 1, increase of the connection terminal quantity of the new wiring line L3 (the connection terminal quantity of the wiring line L3: "0"→"3") and outputs connection increase/decrease information A1. Based on the information, the display color changing section 3 outputs wiring display color information A2 corresponding to the connection terminal quantity "3" of the wiring line L3 so that the wiring line L3 is displayed on the screen by the display section 4. Here, it is assumed that the display color corresponding to the connection terminal quantity "3" is yellow. It is to be noted that the wiring line L1 and the wiring line L2 are not processed any more because they themselves are abandoned from the wiring connection information 1 and do not exist any more.

Figure 5:
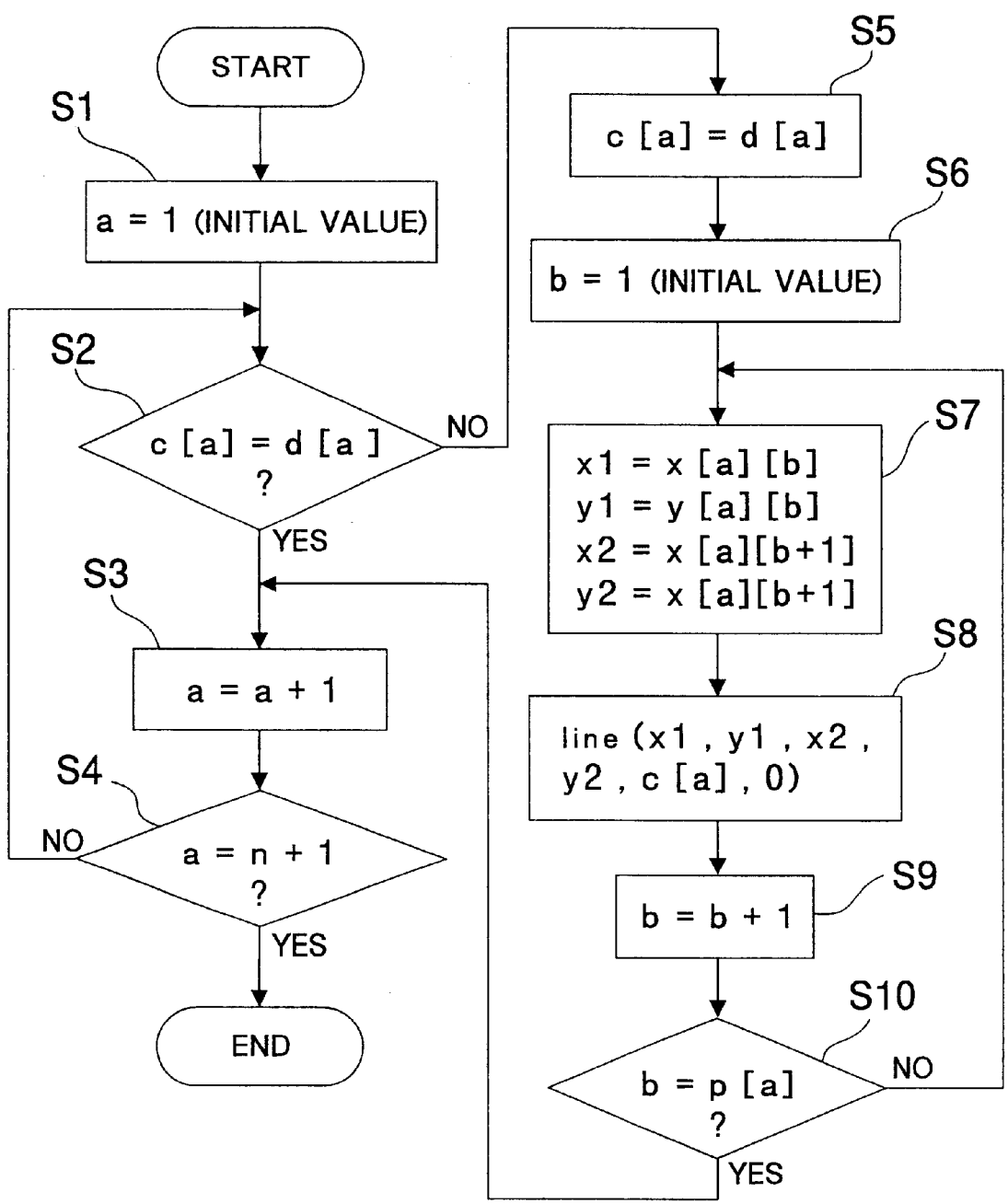
FIG. 5 is a flow chart illustrating operation of a display color changing section of the wiring connection checking apparatus of FIG. 1.

Now, operation of the display color changing section 3 of the wiring connection checking apparatus is described with reference to FIG. 5 in which the operation is described using a program language (C language). The operation is started when the display color changing section 3 receives the connection increase/decrease information A1 from the wiring updating detection section 2. Wiring line numbers are allocated to all wiring lines, and in order to successively discriminate those of all wiring lines which require changing of the display color, the value "1" (initial value) representing the first wiring line is set to the wiring line number a (step S1). Then, current wiring line display color information C[a] of the wiring line corresponding to the wiring line number a (here, "1") and wiring line display color information d[a] corresponding to the connection terminal number of the wiring line are compared with each other to discriminate whether or not they are equal to each other (step S2). If they are equal in step S2 (Yes), then the display color changing section 3 discriminates that the display color of the wiring line need not be changed and then increments the value of the wiring line number a by one (step S3) in order to prepare for processing of the next wiring line number. Then, the display color changing section 3 discriminates whether or not the value of the wiring line number as a result of the operation in step 3 is greater than the value "n" corresponding to the last wiring line (that is, equal to "n+1") (step S4). If it is discriminated in step S4 that the value of the wiring line number is not greater than the value "n" (No), then the processing returns to step S2 so that the display color changing section 3 subsequently performs processing for the next wiring line number a. On the other hand, if it is discriminated in step S4 that the value of the wiring line number is greater than the value "n" (Yes), since this signifies that the processing for the display color change of all of the wiring lines is completed, the display color changing section 3 ends its processing.

On the other hand, if it is discriminated in step S2 that the current wiring line display color information C[a] and the wiring line display color information d[a] are not equal to each other (No), then the display color changing section 3 discriminates that it is necessary to change the display color of the wiring line and changes the current wiring line display color information C[a] of the pertaining wiring line so that it becomes equal to the wiring line display color information d[a] corresponding to the connection terminal quantity of the pertaining wiring line (step S5). Further, the changing of the display color of the wiring line is performed in accordance with the order of a wiring line path (part terminals to be connected), and therefore, the display color changing section 3 sets the value "1" (initial value) representative of the first connection terminal to the terminal number b representative of the order number of the part terminal to which the wiring line is connected (step S6). Then, the display color changing section 3 sets the x coordinate value "x[a] [b]" of the terminal corresponding to the terminal number b (here, "1") to x1, the y coordinate value "y[a][b]" of the terminal to y1, the x coordinate value "x[a] [b+1]" of the terminal corresponding to the terminal number b+1 representative of the next connection terminal to x2, and the y coordinate value "y[a] [b+1]" of the terminal to y2 (step S7). Then, based on the coordinate values x1 and y1 of the terminal corresponding to the terminal number b and the coordinate values x2 and y2 of the terminal corresponding to the terminal number b+1 representative of the next connection terminal all obtained in step S7 as well as the value of the wiring line display color C[a], the display color changing section 3 changes the display color of the wiring line between the terminals corresponding to the terminal number b and the terminal number b+1 connected by the wiring line to the wiring line display color c[[a] using the line function of the program language (step S8). It is to be noted that the display color changing processing is performed for wiring lines between all terminals connected by the wiring line, and in order to prepare for processing for the next terminal number, the display color changing section 3 increments the value of the terminal number b by one (step S9). Then, the display color changing section 3 compares the value of the terminal number b as a result of the operation in step S9 with the value of the connection terminal number p[a] of the wiring line to discriminate whether they are equal to each other (step S10). If the two values are not equal to each other in step S10 (No), then the processing returns to step S7 to perform processing for the next terminal number b. However, if the two values are equal to each other in step S10 (Yes), then since this signifies that the processing for the display color changing of all of the wiring lines between the terminals connected by the wiring line is completed, the processing of the display color changing section 3 returns to step S3.

It is be noted that, although the foregoing description is given of the case wherein only the wiring display color changing section 31 of the display color changing section 3 of the wiring connection checking apparatus operates, the present invention is not limited to this. For example, the part terminal display color changing section 32 may operate in response to contents of the change of the wiring display color changing section 31 so that the display colors of both of a wiring line and part terminals connecting to the wiring line may be changed. Alternatively, only the part terminal display color changing section 32 may operate. The display colors of wiring lines and part terminals may be any colors only if they can be visually checked readily, and as the kinds of colors, particular kinds of colors may be used in a circulating manner within a range within which they do not disturb checking. Further, the object of connection checking for a wiring line is not limited to a terminal of a part but may be, for example, a graphic form, a character or characters, or a dot. Furthermore, the operation of the display color changing section 3 is not limited to that described using the program language (C language), but may be described using any other program language.

While a preferred embodiment of the present invention has been described using specific terms, such description is for illustrative purposes only, and it is to be understood that changes and variations may be made without departing from the spirit or scope of the following claims.

What is claimed is:

1. A wiring connection checking apparatus for a CAD system for designing a circuit on a screen, comprising:
    a wiring updating detection section for detecting, based on wiring connection information inputted by a user of said wiring connection checking apparatus, that a connection condition of a wiring line and a part terminal is updated based on a change in a connected state of said wiring line;
    a display color changing section for changing at least one of the display color of the wiring line and the display color of said part terminal connected by the wiring line in response to the updating of the connection condition of said wiring line and said part terminal; and
    a display section for displaying a result of the changing by said display color changing section on said screen.

2. A wiring connection checking apparatus for a CAD system for designing a circuit on a screen comprising:
    a wiring updating detection section for detecting, based on wiring connection information inputted by a user of said wiring connection checking apparatus, that a connection condition of a wiring line is updated;
    a display color changing section for changing at least one of the display color of the wiring line and the display color of a part terminal connected by the wiring line in response to the updating of the connection condition of said wiring line and said part terminal; and
    a display section for displaying a result of the changing by said display color changing section on said screen,
    wherein said wiring updating detection section detects an increase or decrease of the quantity of said part terminals connected by the wiring line.

3. A wiring connection checking method for a CAD system for designing a circuit on a screen, comprising:
    detecting, based on wiring connection information inputted by a user of said CAD system, that a connection condition of a wiring line and a part terminal is updated based on a change in a connected state of said wiring line;
    changing at least one of the display color of the wiring line and the display color of said part terminal connected by the wiring line in response to the updating of the connection condition of said wiring line and said part terminal; and
    displaying a result of the changing of the display color on said screen.

4. A recording medium on which a computer-readable program used for checking a connection of a wiring line in a CAD system for designing a circuit on a screen, the program causing a computer to execute, comprising:
    a wiring updating detection process of detecting, based on wiring connection information inputted by a user of said CAD system, that a connection condition of a wiring line and a part terminal is updated based on a change in a connected state of said wiring line;
    a display color changing process of changing at least one of a display color of the wiring line and a display color of said part terminal connection connected by the wiring line in response to the updating of the connection condition of said wiring line and said part terminal; and
    a displaying process of displaying a result of the changing of the display color on said screen.

5. The wiring connection checking apparatus according to claim 1, wherein said display color of said wiring line and said part terminals comprises a plurality of colors, said plurality of colors being visually identifiable.

6. A wiring connection checking method for a CAD system for designing a circuit on a screen, comprising:
    detecting, based on wiring connection information inputted by a user of said CAD system, that a connection condition of a wiring line and a part terminal is updated;
    changing at least one of the display color of the wiring line and the display color of said part terminal connected by the wiring line in response to the updating of the connection condition of said wiring line and said part terminal;
    displaying a result of the changing of the display color on said screen; and
    allocating a wiring line numbers to said wiring lines for use when determining change of said display color.

7. The wiring connection checking method according to claim 6, further comprising:
    corresponding a first wiring line display color information of said wiring line to said wiring line number.

8. The wiring connection checking method according to claim 7, further comprising:
    corresponding a second wiring line display color information to a connection terminal number of said wiring line.

9. The wiring connection checking method according to claim 8, further comprising:
    incrementing a value of said wiring line number and maintaining said display color of said wiring line, when said second wiring line display color information is equal to said first wiring line display color information.

10. The wiring connection checking method according to claim 9, further comprising:

processing a subsequent wiring line number when said value of said wiring line number is not greater than a value of the previous said wiring line, said previous wiring line comprises said value of the previous said wiring line+1; and maintaining said subsequent wiring line number when said value of said wiring line number is greater than said value corresponding to the previous said wiring line as said display color changes are completed.

11. The wiring connection checking method according to claim 9, further comprising:

changing said display color of said first wiring line to equal said second wiring line display color information when said second wiring line display color information is not equal to said first wiring line display color information.

12. The wiring connection checking method according to claim 11, further comprising:

corresponding a first coordinate value of a terminal to a terminal number which is set to a first value; and setting a second coordinate value of said terminal to a second value, said first coordinate value of said terminal corresponds to a terminal number which represents a next connection terminal, and said second coordinate value of said terminal is set to a third value.

13. The wiring connection checking method according to claim 12, further comprising:

processing a subsequent terminal number when said value of said terminal number is not equal to a value of a connection terminal number of said wiring line; and maintaining said subsequent wiring line number when said value of said terminal number is equal to a value of said connection terminal number of said wiring line as said display color changes are completed.

14. A recording medium tangibly embodying a program of machine-readable instructions executable by a computer to perform a method of checking a connection of a wiring line in a CAD system for designing a circuit on a screen, said method comprising:

detecting, based on wiring connection information inputted by a user of said CAD system, that a connection condition of a wiring line and a part terminal is updated based on a change in a connected state of said wiring line;

changing at least one of a display color of the wiring line and a display color of said part terminal connection connected by said wiring line in response to the updating of said connection condition of said wiring line and said part terminal; and displaying a result of the changing of said display color on said screen.

15. A wiring connection checking apparatus for a CAD system for designing a circuit on a screen, comprising:

a wiring updating detection section for detecting, based on wiring connection information inputted by a user of said wiring connection checking apparatus, that a connection checking status of a wiring line and at least one of a graphic form, a character and a dot, is updated, based on a change in a connected state of said wiring line;

a display color changing section for changing at least one of a display color of the wiring line and a display color of at least one of a graphic form, a character and a dot connected by the wiring line in response to the updating of the connection of said wiring line and said part terminal; and a display section for displaying a result of the change by said display color changing section on said screen.

* * * * *